(12) United States Patent
Meguro et al.

(10) Patent No.: US 10,438,830 B2
(45) Date of Patent: Oct. 8, 2019

(54) SEMICONDUCTOR MANUFACTURING APPARATUS AND WAFER HOLDING METHOD

(71) Applicant: TOSHIBA MEMORY CORPORATION, Minato-ku, Tokyo (JP)

(72) Inventors: Mitsuyoshi Meguro, Yokkaichi Mie (JP); Takafumi Ochiai, Kuwana Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/907,133

(22) Filed: Feb. 27, 2018

(65) Prior Publication Data
US 2019/0080950 A1    Mar. 14, 2019

(30) Foreign Application Priority Data
Sep. 13, 2017  (JP) .................. 2017-176076

(51) Int. Cl.
*H01L 21/683*    (2006.01)
*H01L 21/67*    (2006.01)

(52) U.S. Cl.
CPC .... *H01L 21/6833* (2013.01); *H01L 21/67063* (2013.01); *H01L 21/67288* (2013.01); *H01L 21/6831* (2013.01); *H01L 21/6838* (2013.01)

(58) Field of Classification Search
CPC ............. H01L 21/67063; H01L 21/683; H01L 21/6831; H01L 21/6833; B29C 65/7841; B29C 66/03241

USPC ......................................... 156/367, 368, 378
See application file for complete search history.

(56) References Cited

U.S. PATENT DOCUMENTS

| 8,389,411 B2 | 3/2013 | Ishida et al. |
| 2003/0164934 A1* | 9/2003 | Nishi .................. G03F 7/70358 355/72 |
| 2005/0095776 A1* | 5/2005 | Usuami ............. H01L 21/67109 438/232 |

FOREIGN PATENT DOCUMENTS

| JP | H04-359539 A | 12/1992 |
| JP | H07-283296 A | 10/1995 |

* cited by examiner

*Primary Examiner* — George R Koch
(74) *Attorney, Agent, or Firm* — Foley & Lardner LLP

(57) ABSTRACT

A semiconductor manufacturing apparatus includes an electrostatic chuck stage for configured to hold a wafer and supplying gas from a gas supply source to the wafer. The electrostatic chuck stage includes a first opening that supplies the gas to a first portion located at a first distance from the center of the wafer, and a second opening that supplies the gas to a second portion located at a second distance from the center of the wafer. The second distance being greater than the first distance. A first measurement instrument configured to measure a physical quantity of the gas between the gas supply source and the first opening, and a second measurement instrument configured to measure a physical quantity of the gas between the gas supply source and the second opening. An output device outputs information on the wafer based on the physical quantities measured by the first and second measurement instruments.

17 Claims, 4 Drawing Sheets

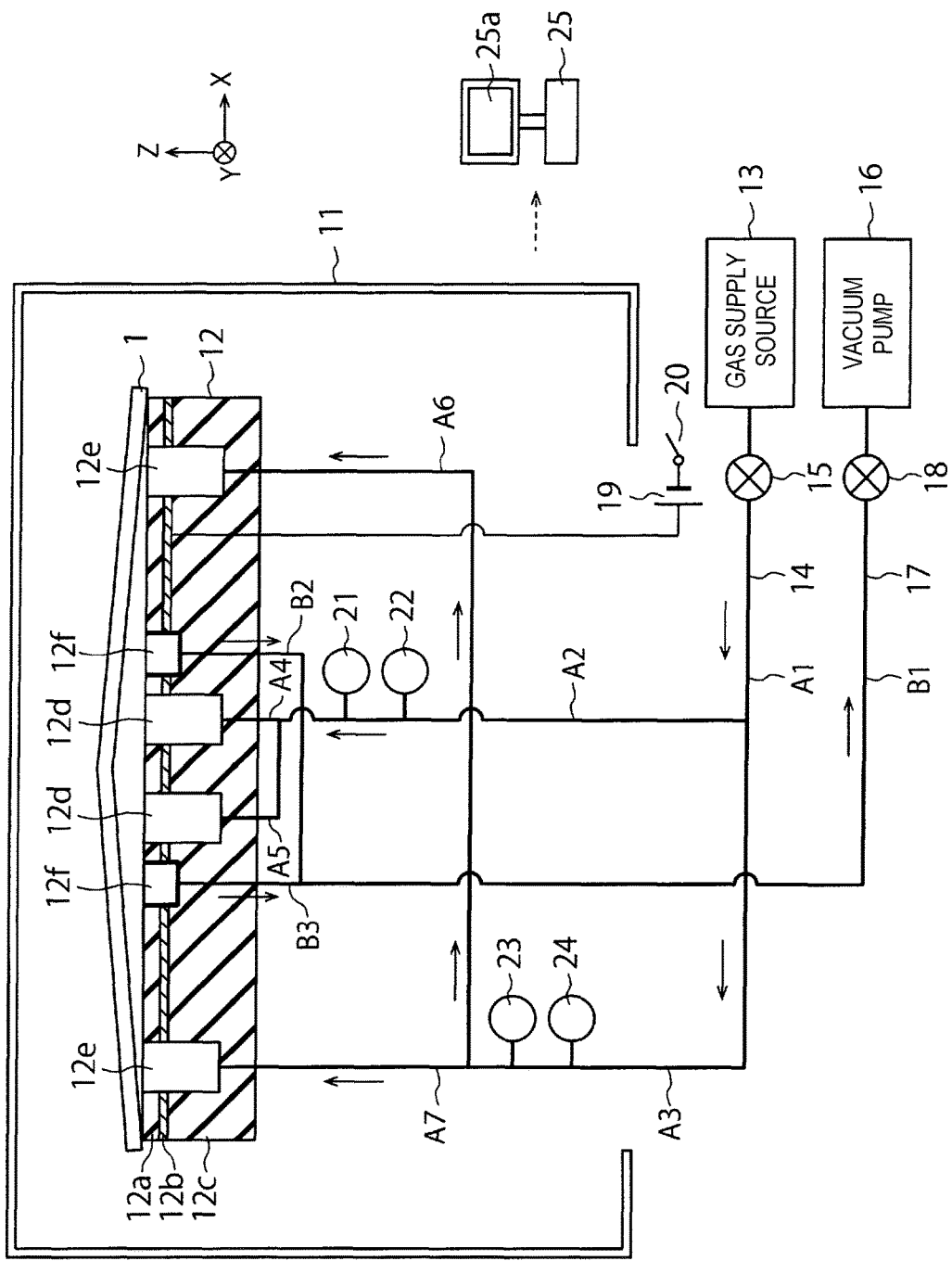

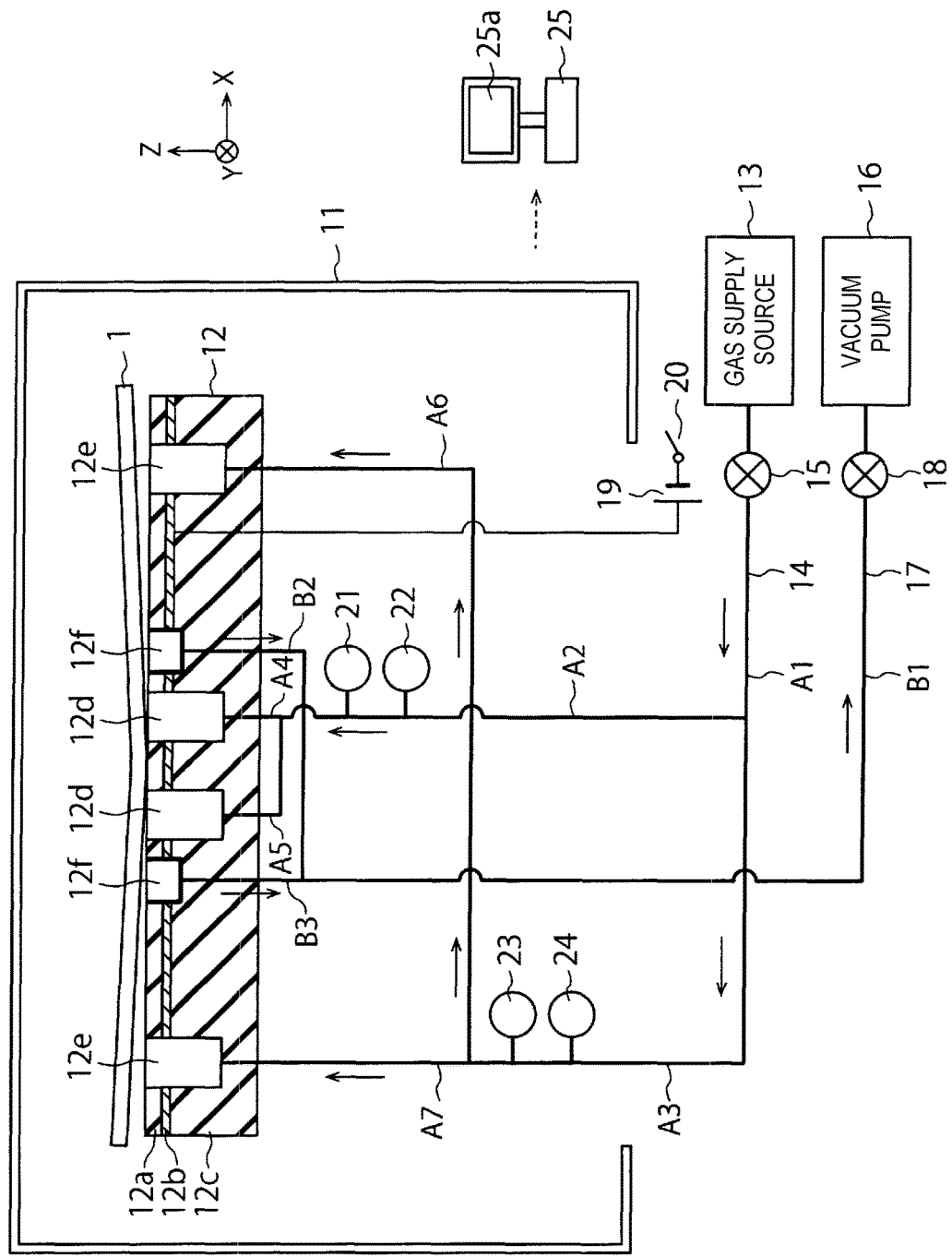

SEMICONDUCTOR MANUFACTURING APPARATUS AND WAFER HOLDING METHOD

CROSS-REFERENCE TO RELATED APPLICATION

This application claims the benefit of and priority to Japanese Patent Application No. 2017-176076, filed Sep. 13, 2017, the entire contents of which are incorporated herein by reference.

FIELD

An embodiment described herein relates generally to a semiconductor manufacturing apparatus and a wafer holding method.

BACKGROUND

In a semiconductor manufacturing apparatus that holds (chucks) a wafer by an electrostatic chuck stage, gas is supplied from a gas supply source to a wafer via an electrostatic chuck stage, and the flow rate and pressure of the gas between the gas supply source and the electrostatic chuck stage are measured.

DESCRIPTION OF THE DRAWINGS

FIG. 3 is a cross-sectional view (1/2) for explaining the operation of the semiconductor manufacturing apparatus of the first embodiment; and FIG. 4 is a cross-sectional view (2/2) for explaining the operation of the semiconductor manufacturing apparatus of the first embodiment.

DETAILED DESCRIPTION

Embodiments are provided describing a semiconductor manufacturing apparatus capable of detecting the state of a wafer, and a corresponding wafer holding method.

In general, according to some embodiments, a semiconductor manufacturing apparatus includes an electrostatic chuck stage configured to hold a wafer and supplying gas from a gas supply source to the wafer, wherein the electrostatic chuck stage includes a first opening that supplies the gas to a first portion located at a first distance from the center of the wafer, and a second opening that supplies the gas to a second portion located at a second distance from the center of the wafer. The second distance being greater than the first distance. The apparatus further includes a first measurement instrument configured to measure a physical quantity of the gas between the gas supply source and the first opening, and a second measurement instrument configured to measure a physical quantity of the gas between the gas supply source and the second opening. The apparatus further includes an output device configured to output information on the wafer based on the physical quantity measured by the first measurement instrument and the physical quantity measured by the second measurement instrument.

An embodiment of the present disclosure will be described below with reference to the accompanying drawings.

First Embodiment

Figure 1:
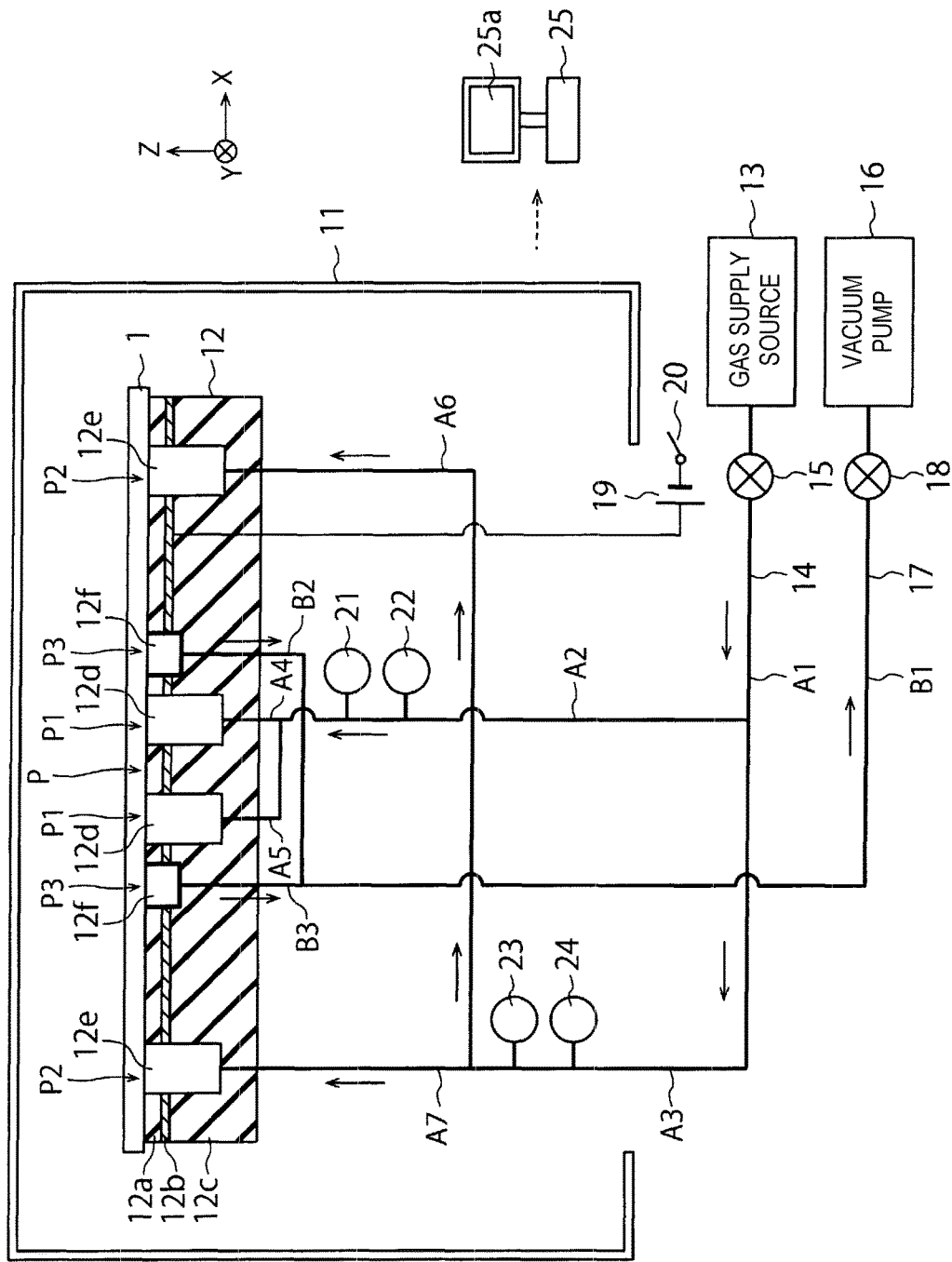
FIG. 1 is a cross-sectional view schematically showing an arrangement of a semiconductor manufacturing apparatus of a first embodiment.

FIG. 1 is a cross-sectional view schematically showing an arrangement of a semiconductor manufacturing apparatus of a first embodiment.

The semiconductor manufacturing apparatus of FIG. 1 is an apparatus for processing a wafer 1, and is, for example, a CVD (Chemical Vapor Deposition) apparatus, a PVD (Physical Vapor Deposition) apparatus, a RIE (Reactive Ion Etching) apparatus or the like. For example, in the case of forming a metal layer on the wafer 1 or processing a metal layer on the wafer 1, warpage of the wafer 1 may be a problem. Specifically, because of the warpage of the wafer 1, a conveyance trouble of the wafer 1 may occur.

FIG. 1 shows an X direction and a Y direction which are parallel to the surface of the wafer 1 and perpendicular to each other, and a Z direction which is perpendicular to the surface of the wafer 1. In the present specification, the +Z direction is taken as an upward direction, and the −Z direction is taken as a downward direction. The −Z direction may or may not be coincident with the direction of gravity.

The semiconductor manufacturing apparatus of FIG. 1 includes a vacuum chamber 11, an electrostatic chuck stage 12, a gas supply source 13, a gas introduction pipe 14, a gas introduction valve 15, a vacuum pump 16, a gas discharge pipe 17, a gas discharge valve 18, a power supply 19 and a switch 20. The electrostatic chuck stage 12 includes an insulating portion 12a, an electrode plate 12b, a base portion 12c, a first gas introduction groove 12d which is an example of a first opening, a second gas introduction groove 12e which is an example of a second opening, and a gas discharge groove 12f which is an example of an opening.

The semiconductor manufacturing apparatus of FIG. 1 further includes a first flow meter 21, a first pressure gauge 22, a second flow meter 23, a second pressure gauge 24 and an information processing unit 25. The first flow meter 21 and the first pressure gauge 22 are examples of a first measuring device or measurement instrument. The second flow meter 23 and the second pressure gauge 24 are examples of a second measuring device or measurement instrument. The information processing unit 25 is an example of an output unit. The information processing unit 25 includes a display unit 25a.

As shown in FIG. 1, the vacuum chamber 11 accommodates the wafer 1, and the electrostatic chuck stage 12 holds (chucks) the wafer 1. The electrostatic chuck stage 12 includes the electrode plate 12b between the insulating portion 12a and the base portion 12c, and electrostatically attracts the wafer 1 by the electrode plate 12b. The first gas introduction groove 12d, the second gas introduction groove 12e and the gas discharge groove 12f have an annular shape and are provided on the upper surface of the electrostatic chuck stage 12. The side surfaces of these grooves are covered with an insulating film, not shown.

Figure 2:
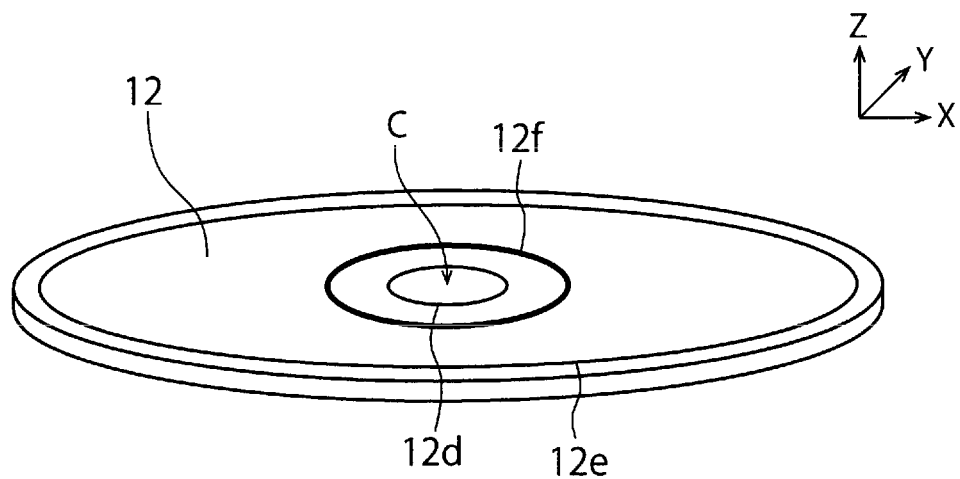
FIG. 2 is a perspective view schematically showing the outer shape of an electrostatic chuck stage of FIG. 1.

FIG. 2 is a perspective view schematically showing the outer shape of the electrostatic chuck stage 12 of FIG. 1.

The point C represents the center of the upper surface of the electrostatic chuck stage 12. The first gas introduction groove 12d, the second gas introduction groove 12e and the gas discharge groove 12f of the embodiment have a circular shape centered on the point C. Here, the diameter of the first gas introduction groove 12d is 10 mm, the diameter of the second gas introduction groove 12e is 280 mm, and the diameter of the gas discharge groove 12f is 50 mm. Therefore, the second gas introduction groove 12e surrounds the first gas introduction groove 12d, and the gas discharge groove 12f is located between the first gas introduction groove 12d and the second gas introduction groove 12e.

Referring to FIG. 1 again, the description of the semiconductor manufacturing apparatus will be continued.

The gas supply source 13 supplies gas to the electrostatic chuck stage 12 via the gas introduction pipe 14. An example gas is an inert gas such as argon gas. The gas introduction pipe 14 includes pipes A1 to A7.

The pipe A1 is connected to the gas supply source 13, and has the gas introduction valve 15. The pipe A1 branches to the pipes A2 and A3, the pipe A2 branches to the pipes A4 and A5, and the pipe A3 branches to the pipes A6 and A7. The first gas introduction groove 12d is supplied with gas from the pipes A4 and A5, and supplies gas to the lower surface of the wafer 1. The second gas introduction groove 12e is supplied with gas from the pipes A6 and A7, and supplies gas to the lower surface of the wafer 1. The first gas introduction groove 12d may be supplied with gas from three or more pipes. In addition, the second gas introduction groove 12e may also be supplied with gas from three or more pipes. The process of supplying gas from the gas supply source 13 to the electrostatic chuck stage 12 can be controlled by the opening and closing and the opening degree of the gas introduction valve 15.

The vacuum pump 16 discharges gas supplied to the wafer 1 via the gas discharge groove 12f and the gas discharge pipe 17. The gas discharge pipe 17 includes pipes B1 to B3.

The pipe B1 is connected to the vacuum pump 16, and has a gas discharge valve 18. The pipe B1 branches to the pipes B2 and B3. The gas supplied to the wafer 1 is discharged from the gas discharge groove 12f to the pipes B2 and B3, and transferred from the pipes B2 and B3 to the pipe B1. The gas discharge groove 12f may discharge gas from three or more pipes. The process of discharging gas from the electrostatic chuck stage 12 by the vacuum pump 16 can be controlled by the opening and closing and the opening degree of the gas discharge valve 18.

The power supply 19 generates a potential difference between the wafer 1 and the electrode plate 12b. The switch 20 is used to control on/off of the power supply 19.

FIG. 1 shows the center P of the wafer 1. If the center P of the wafer 1 deviates from the center C (FIG. 2) of the electrostatic chuck stage 12, a defect in the chuck state of the wafer 1 may occur. Therefore, it is preferable that the electrostatic chuck stage 12 chucks the wafer 1 so that the center P of the wafer 1 is located in the vicinity of the center C of the electrostatic chuck stage 12.

FIG. 1 further shows a first portion P1 which is close to the center P of the wafer 1, a second portion P2 which is far from the center P of the wafer 1, and an intermediate portion P3 which is located between the first portion P1 and the second portion P2. The distance (second distance) between the center P and the second portion P2 is farther than the distance (first distance) between the center P and the first portion P1. The first portion P1 is located at the central portion of the wafer 1, and the second portion P2 is located at the outer peripheral portion of the wafer 1.

The first gas introduction groove 12d supplies gas to the first portion P1 of the wafer 1. The second gas introduction groove 12e supplies gas to the second portion P2 of the wafer 1. As a result, these gases are introduced into the gap between the lower surface of the wafer 1 and the upper surface of the electrostatic chuck stage 12. These gases move toward the intermediate portion P3 and are discharged from the gas discharge groove 12f, or move toward the end portion of the wafer 1 and are discharged from the gap into the vacuum chamber 11. The positions of the first portion P1, the second portion P2 and the intermediate portion P3 are changed as the center P of the wafer 1 deviates from the center C of the electrostatic chuck stage 12.

The first flow meter 21 and the first pressure gauge 22 are provided in the pipe A2, and measure the flow rate and pressure of gas flowing through the pipe A2. The flow rate measurement result is output from the first flow meter 21 to the information processing unit 25. The pressure measurement result is output from the first pressure gauge 22 to the information processing unit 25. These flow rate and pressure correspond to the flow rate and pressure of the gas supplied to the first gas introduction groove 12d.

The second flow meter 23 and the second pressure gauge 24 are provided in the pipe A3, and measure the flow rate and pressure of gas flowing through the pipe A3. The flow rate measurement result is output from the second flow meter 23 to the information processing unit 25. The pressure measurement result is output from the second pressure gauge 24 to the information processing unit 25. These flow rate and pressure correspond to the flow rate and pressure of the gas supplied to the second gas introduction groove 12e.

The first flow meter 21, the first pressure gauge 22, the second flow meter 23 and the second pressure gauge 24 of the embodiment are measuring devices with contacts. The information processing unit 25 can acquire the measurement results of these measuring devices from the contacts. In the embodiment, the flow rate and pressure of gas supplied to the first and second gas introduction grooves 12d and 12e are the measurement targets, but other physical quantities may be the measurement targets.

The information processing unit 25 is a device that performs various kinds of information processing, and controls, for example, various kinds of operation of the semiconductor manufacturing apparatus. Specifically, the information processing unit 25 controls the operation of the vacuum chamber 11, the electrostatic chuck stage 12, the gas supply source 13 and the vacuum pump 16, the opening and closing and the opening degree of the gas introduction valve 15 and the gas discharge valve 18, on/off of the switch 20 and the like. An example of the information processing unit 25 includes a processor, an electric circuit or a computer. The information processing unit 25 may include a display unit 25a such as a liquid crystal display.

The information processing unit 25 further outputs information on the wafer 1 based on the flow rate (first flow rate) from the first flow meter 21, the pressure (first pressure) from the first pressure gauge 22, the flow rate (second flow rate) from the second flow meter 23 and the pressure (second pressure) from the second pressure gauge 24.

For example, the information processing unit 25 determines whether the wafer 1 is warped based on the first flow rate, the first pressure, the second flow rate, and the second pressure. Then, the information processing unit 25 displays on the display unit 25a, the determination result, for example, the wafer 1 is not warped, the wafer 1 has convex warpage, and the wafer 1 has concave warpage. Instead of displaying the determination result on the display unit 25a, the information processing unit 25 may store the determination result in the storage unit of the information processing unit 25, or may transmit the determination result to an external device. Further, the information processing unit 25 may display the measurement results of the first flow rate, the first pressure, the second flow rate and the second pressure on the display unit 25a.

Further, when the information processing unit 25 determines that the wafer 1 is warped, the information processing unit 25 may display an alarm on the display unit 25a that there is abnormality in the wafer 1. In this case, the information processing unit 25 may output an alarm such as sounding a buzzer, lighting a lamp, or the like.

Hereinafter, a method of determining whether or not the wafer 1 is warped will be described in detail with reference to FIGS. 3 and 4. FIGS. 3 and 4 are cross-sectional views for explaining the operation of the semiconductor manufacturing apparatus of the first embodiment.

FIG. 3 shows a case where the wafer 1 warped in the compression direction (convex direction) is placed on the electrostatic chuck stage 12. In this case, the distance between the wafer 1 and the electrostatic chuck stage 12 is increased in the vicinity of the first gas introduction groove 12d, and the increased gas flows from the first gas introduction groove 12d into the gas discharge groove 12f. As a result, the first flow rate from the first flow meter 21 increases, and the first pressure from the first pressure gauge 22 decreases. On the other hand, the second flow rate from the second flow meter 23 and the second pressure from the second pressure gauge 24 are maintained substantially constant.

In this case, the information processing unit 25 can determine that there is an abnormality in the wafer 1 in the vicinity of the first gas introduction groove 12d, and that there is no abnormality in the wafer 1 in the vicinity of the second gas introduction groove 12e. As a result, it can be determined that the wafer 1 has convex warpage. The information processing unit 25 displays on the display unit 25a the determination result that the wafer 1 has convex warpage.

FIG. 4 shows a case where the wafer 1 warped in the pulling direction (concave direction) is placed on the electrostatic chuck stage 12. In this case, the distance between the wafer 1 and the electrostatic chuck stage 12 is increased in the vicinity of the second gas introduction groove 12e, and the increased gas flows from the second gas introduction groove 12e to the vacuum chamber 11. As a result, the second flow rate from the second flow meter 23 increases, and the second pressure from the second pressure gauge 24 decreases. On the other hand, the first flow rate from the first flow meter 21 and the first pressure from the first pressure gauge 22 are maintained substantially constant.

In this case, the information processing unit 25 can determine that there is abnormality in the wafer 1 in the vicinity of the second gas introduction groove 12e, and there is no abnormality in the wafer 1 in the vicinity of the first gas introduction groove 12d. As a result, it can be determined that the wafer 1 has concave warpage. The information processing unit 25 displays on the display unit 25a the determination result that the wafer 1 has concave warpage.

It is noted that whether or not there is an abnormality in the wafer 1 can be determined, for example, by using a threshold value. For example, when the first flow rate is greater than a flow rate threshold value and the first pressure is lower than a pressure threshold value, it can be determined that there is no abnormality in the wafer 1 in the vicinity of the second gas introduction groove 12e. This AND condition may be replaced by an OR condition that the first flow rate is larger than the flow rate threshold value or the first pressure is lower than the pressure threshold value. This also applies to the second flow rate and the second pressure.

When determining that the wafer 1 is warped, the information processing section 25 places the semiconductor manufacturing apparatus in a standby state, and temporarily stops the processing (whether CVD, PVD, RIE and the like) of the wafer 1. The information processing unit 25 further dechucks the wafer 1 from the electrostatic chuck stage 12, and carries out the wafer 1 from the vacuum chamber 11 to a load lock chamber, not shown, of the semiconductor manufacturing apparatus. The administrator of the semiconductor manufacturing apparatus may take out the wafer 1 from the load lock chamber to the outside of the semiconductor manufacturing apparatus, and confirm the state of the wafer 1. In this case, the administrator may release the standby state of the semiconductor manufacturing apparatus after taking out the wafer 1, and start the processing of the next wafer 1 in the semiconductor manufacturing apparatus.

The electrostatic chuck stage 12 may further include one or more third gas introduction grooves between the first gas introduction groove 12d and the second gas introduction groove 12e. In this case, each of the third gas introduction grooves has an annular shape (specifically, a circular shape), and supplies gas to a third portion between the first portion P1 and the second portion P2 of the wafer 1. A pipe for supplying gas to the third gas introduction groove is provided with a third flow meter having the same function as the function of the first and second flow meters 21 and 23, and a third pressure gauge having the same function as the function of the first and second pressure gauges 22 and 24. The information processing unit 25 can determine the state of the wafer 1 in more detail based on the measurement results of the flow rate and pressure acquired from these measuring devices. The third gas introduction groove is an example of a third opening.

For example, the information processing unit 25 can determine the warpage state of the wafer 1 in more detail. As an example, as shown in FIG. 3, it is assumed that the first flow rate and the first pressure are abnormal and the second flow rate and the second pressure are normal. In this case, if the measured values from the third flow meter and the third pressure gauge are normal, it can be determined that large warpage is generated only in the vicinity of the first gas introduction groove 12d. On the other hand, if the measured values from the third flow meter and the third pressure gauge are abnormal, it can be determined that large warpage is generated also in the vicinity of the third gas introduction groove.

As described above, in the semiconductor manufacturing apparatus of the embodiment, the first and second gas introduction grooves 12d and 12e are provided in the electrostatic chuck stage 12 to monitor the flow rate and pressure of gas to be supplied to the first and second gas introduction grooves 12d and 12e. Therefore, according to the embodiment, it is possible to detect the state of the wafer 1, such as whether or not the wafer 1 is warped.

For example, it is assumed that a defect occurs in the chuck state of the wafer 1. In this case, when the cause of the defect is in the equipment in the semiconductor manufacturing apparatus, it is necessary to stop and inspect the semiconductor manufacturing apparatus. On the other hand, when the cause of the defect is in the wafer 1, it is unnecessary to stop or inspect the semiconductor manufacturing apparatus, and it is desirable to immediately start the processing of the next wafer 1. However, in the past, since there is no approach for finding out the cause of a defect, it is necessary for the administrator to completely stop the semiconductor manufacturing apparatus and inspect the cause of the defect. According to the embodiment, since the administrator can find out from the display unit 25a that the cause of the defect is present in the wafer 1, it is possible to avoid forcing such stoppage or inspection when the wafer 1 has been determined to be the cause of the defect. As a result, productivity of the semiconductor manufacturing apparatus can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor manufacturing apparatus, comprising:
an electrostatic chuck stage configured to hold a wafer and to supply gas from a gas supply source to the wafer, wherein the electrostatic chuck stage includes a first opening that supplies the gas to a first portion located at a first distance from a center of the wafer, and a second opening that supplies the gas to a second portion located at a second distance from the center of the wafer, the second distance being greater than the first distance;
a first gas measurement instrument configured to measure a first flow rate and pressure of the gas between the gas supply source and the first opening;
a second gas measurement instrument configured to measure a second flow rate and pressure of the gas between the gas supply source and the second opening;
an output device configured to determine whether the wafer is warped and to output information on warpage the wafer based on the first flow rate and pressure measured by the first gas measurement instrument and the second flow rate and pressure measured by the second gas measurement instrument;
a discharge groove in the chuck stage; and
a gas discharge pipe connected to the discharge groove, the discharge groove and gas discharge pipe arranged to discharge gas supplied to the wafer.

2. The semiconductor manufacturing apparatus according to claim 1, wherein the output device comprises at least one of a processor, an electric circuit, or a computer.

3. The semiconductor manufacturing apparatus according to claim 2, wherein the output device includes a display configured to display the information on the wafer.

4. The semiconductor manufacturing apparatus according to claim 1, wherein the output device is configured to control the electrostatic chuck stage and the gas supply source.

5. The semiconductor manufacturing apparatus according to claim 1, wherein the information on warpage of the wafer includes information on whether the wafer is warped in a concave manner, or in a convex manner.

6. The semiconductor manufacturing apparatus according to claim 1, wherein the output device is configured to output information regarding whether the wafer is abnormal.

7. The semiconductor manufacturing apparatus according claim 6, wherein the output device is configured to determine whether the wafer is abnormal based on a comparison of the first flow rate and pressure measured by the first gas measurement instrument or the second flow rate and pressure measured by the second gas measurement instrument with a threshold value.

8. The semiconductor manufacturing apparatus according to claim 1, wherein the output device is configured to output an alarm relating to the wafer.

9. The semiconductor manufacturing apparatus according to claim 1, wherein
the first opening has an annular shape, and
the second opening has an annular shape surrounding the first opening.

10. The semiconductor manufacturing apparatus according to claim 1, wherein the electrostatic chuck stage further comprises one or more third openings for supplying the gas to a third portion located at a third distance between the first distance and the second distance from the center of the wafer.

11. The semiconductor manufacturing apparatus according to claim 10, wherein
the first opening has an annular shape,
the one or more third openings have an annular shape surrounding the first opening, and
the second opening has an annular shape surrounding the one or more third openings.

12. The semiconductor manufacturing apparatus according to claim 1, wherein the output device is configured to determine the wafer is warped in a convex manner when the first flow rate is increased and the second flow rate remains substantially constant.

13. The semiconductor manufacturing apparatus according to claim 1, wherein the output device is configured to determine the wafer is warped in a concave manner when the first flow rate remains substantially constant and the second flow rate is increased.

14. A wafer holding method, comprising:
supplying gas from a gas supply source;
holding a wafer by an electrostatic chuck stage including, a discharge groove, a gas discharge pipe connected to the discharge groove, a first opening that supplies the gas to a first portion located at a first distance from the center of the wafer, and a second opening that supplies the gas to a second portion located at a second distance from the center of the wafer, the second distance being greater than the first distance;
discharging gas, via the discharging groove and the gas discharge pipe, supplied to the wafer;
measuring a first flow rate and pressure of the gas between the gas supply source and the first opening by a first gas measurement instrument;
measuring a second flow rate and pressure of the gas between the gas supply source and the second opening by a second gas measurement instrument; and
determining whether the wafer is warped and outputting information on warpage the wafer based on the first flow rate and pressure measured by the first gas measurement instrument and the second flow rate and pressure measured by the second gas measurement instrument.

15. The method according to claim 14, wherein the output information on warpage of the wafer includes information on whether the wafer is warped in a concave manner, or in a convex manner.

16. The method according to claim 15, further comprising outputting an alarm if the output information indicates that the wafer is warped.

17. The method according to claim 14, wherein the electrostatic chuck stage further comprises one or more third openings for supplying the gas to a third portion located at a third distance between the first distance and the second distance from the center of the wafer.

* * * * *